(12) United States Patent
Adam et al.

(10) Patent No.: US 6,676,365 B2
(45) Date of Patent: Jan. 13, 2004

(54) AIR TRACK CONVEYOR SYSTEM FOR DISK PRODUCTION

(75) Inventors: Johann F. Adam, Palo Alto, CA (US); Evan F. Cromwell, Redwood City, CA (US); Eric D. Moen, Fremont, CA (US)

(73) Assignee: Toda Kogyo Corporation, Hiroshima-ken (JP)

( * ) Notice: Subject to any disclaimer, the term of this patent is extended or adjusted under 35 U.S.C. 154(b) by 0 days.

(21) Appl. No.: 09/810,834

(22) Filed: Mar. 16, 2001

(65) Prior Publication Data

US 2002/0182047 A1 Dec. 5, 2002

(51) Int. Cl.[7] ............................................. B65G 49/07
(52) U.S. Cl. ......................... 414/935; 406/83; 406/89; 406/88; 406/154
(58) Field of Search ............................... 406/83, 84, 88, 406/89, 154, 676; 414/935, 936, 939

(56) References Cited

U.S. PATENT DOCUMENTS

| | | | |
|---|---|---|---|
| 898,775 A | 9/1908 | Norton | |
| 3,797,889 A | * 3/1974 | Wilkinson | 198/380 |
| 3,865,254 A | * 2/1975 | Johannsmeier | 198/394 |
| 3,940,243 A | 2/1976 | Adams | 432/144 |
| 4,009,785 A | 3/1977 | Trayes | 214/1 BT |
| 4,015,880 A | * 4/1977 | Colvin et al. | 104/23.2 |
| 4,236,851 A | 12/1980 | Szasz | 406/72 |
| 4,444,531 A | 4/1984 | Baker et al. | 406/88 |
| 4,730,956 A | * 3/1988 | Lenhart | 406/86 |
| 5,222,840 A | * 6/1993 | Ingraham et al. | 226/97.3 |
| 5,518,360 A | * 5/1996 | Toda et al. | 384/12 |
| 6,170,819 B1 | 1/2001 | Crosby et al. | 271/196 |
| 6,203,250 B1 | * 3/2001 | Takeuchi et al. | 406/168 |

* cited by examiner

Primary Examiner—Joseph A. Dillon
(74) Attorney, Agent, or Firm—Nixon & Vanderhye P.C.

(57) ABSTRACT

An air track includes a concave top surface with a plurality of air outlets or a flat surface with a notch and a plurality of air outlets. The body of the air track includes at least one air filter that runs along the length of at least a portion of the body. The air filter divides the body into a first plenum and a second plenum. The air track also includes a hood covering at least a portion of the top surface. The air track further includes a stopper assembly that arrests the motion of a disk. The stopper assembly includes a disk detector that senses the presence of the disk on the air track.

24 Claims, 10 Drawing Sheets

FIG. 3C          FIG. 3D

AIR TRACK CONVEYOR SYSTEM FOR DISK PRODUCTION

FIELD OF INVENTION

The invention relates to the manufacture of magnetic and optical recording media and in particular to a method and an apparatus for transporting small form factor disks from one processing station to another.

BACKGROUND

In semiconductor processing, semiconductor wafers are transferred from one processing station to another. Semiconductor wafers have been transported by means of an air track. As illustrated in prior art FIG. 1, an air track 11 has a generally flat surface 12 for supporting a generally circular disc 13. A manifold 14 in the form of a drilled opening extends along the centerline of air track 11 for receiving air under pressure to be discharged via the uniformly spaced outlets 16 at an angle having a vectorial component extending in the direction in which it is desired to transport disc 13. The side edges 17 serve to guide disc 13 along a predetermined path.

In some systems, it is desirable to guide the paths of disc 13 without mechanical constraints such as side edges 17 because direct contact with mechanical constraints may damage and contaminate disc 13. Contamination to disc 13 can also come from the air used to support disc 13 on air track 11. As illustrated in prior art FIG. 2, the upward flow of air 18 passes around the bottom surface of disc 13 and swirls downwardly onto the top surface of the disc. Any contaminants which may have been entrained in air 18 can therefore attach to the top and bottom surfaces of disc 13.

Thus, what is needed is an air track system optimized for transport of magnetic recording media that minimizes contact with mechanical constraints and reduces contamination from the air that supports the disk.

SUMMARY

In one embodiment of the invention, an air track includes a body having a concave top surface. In another embodiment of the invention, an air track includes a body having an air filter that divides the body into a first plenum above a second plenum. The air filter runs along the length of at least a portion of the body. In yet another embodiment, an air track includes a hood that runs above at least a portion of a top surface of a body. In yet another embodiment, an air track includes a body having a top surface with a notch located approximately at the center of the top surface.

BRIEF DESCRIPTION OF THE DRAWINGS

FIGS. 3A, 3B, 3C, and 3D show various views of an air track in accordance with one embodiment of the invention.

DETAILED DESCRIPTION

Figure 1:
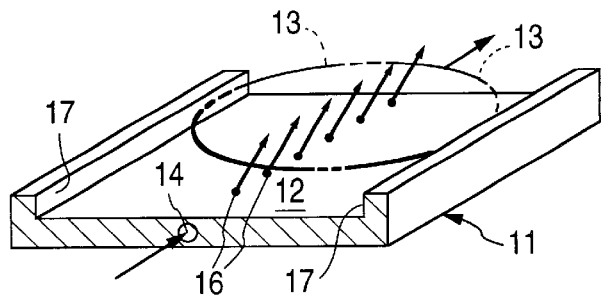
FIG. 1 shows a perspective view of an air track in the prior art.
Figure 2:
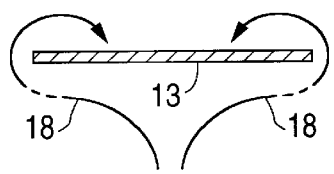
FIG. 2 shows an air flow diagram of the air track of FIG. 1 in the prior art.

FIGS. 3A–3D illustrate an air track 300 in accordance with one embodiment of the invention. Air track 300 forms part of an air track conveyor system that transports magnetic or optical disks from one processing station to another during the manufacturing process. Processing stations are designed to receive disks from and unload disks onto air track 300. For example, air track 300 is used to transport disks from a load station to a lube station. For more details regarding the load station and the lube station, the reader is directed to respective U.S. Application Ser. No. 09/810,854, entitled "Spuffer Pallet Loader", (now is U.S. Pat. No. 6,461,085), and 09/810,835, entitled "Disk Lubrication Mechanism", which are filed herewith, having the same assignee and are incorporated herein by reference.

Air track 300 includes a body 301 defining a plenum 302. Air enters body 301 through an air inlet 314 (shown in FIG. 3A). Body 301 has a top surface 304. Top surface 304 is concave along the length of air track 300. Top surface 304 has a radius R (shown in FIG. 3A). Top surface 304 has air outlets 308 that support a disk 310 transported along air track 300. Air outlets 308 has a diameter of, e.g., 0.03 in. Any pattern of air outlets 308 can be used. Preferably, air outlets 308 are positioned on either side of inner diameter 312 of disk 310 to provide air against the bottom surface of disk 310. Exemplary dimensions of body 301 for transporting a disk of 27.4 mm diameter are provided below.

TABLE 1

| | |
|---|---|
| D1 | 0.2 in. |
| D2 | 0.35 in. |
| D3 | 0.4 in. |
| Ø | 0.03 |
| H | 1.5 in. |
| W | 1.5 in. |
| T | 0.125 in. |
| R | 100 mm |

Depending on the implementation, body 301 may be constructed from a single or multiple pieces of material. Although a straight air track 300 is illustrated in FIGS. 3A–3D, a curved air track 300 can constructed in the same manner.

Figure 3A:
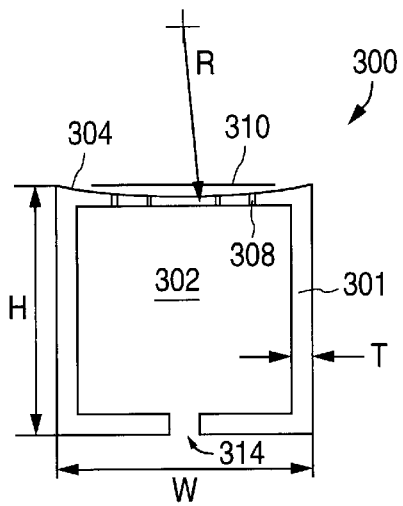
Figure 3B:
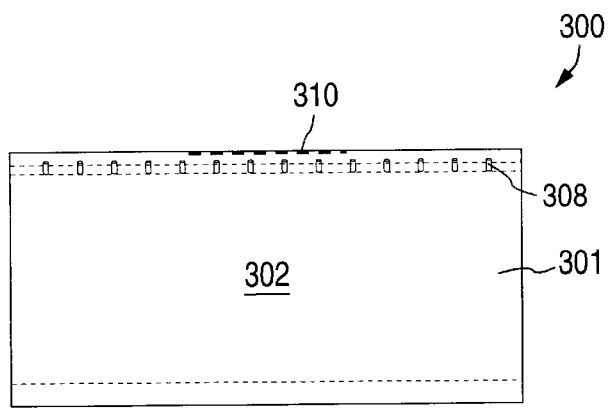
Figure 4A:
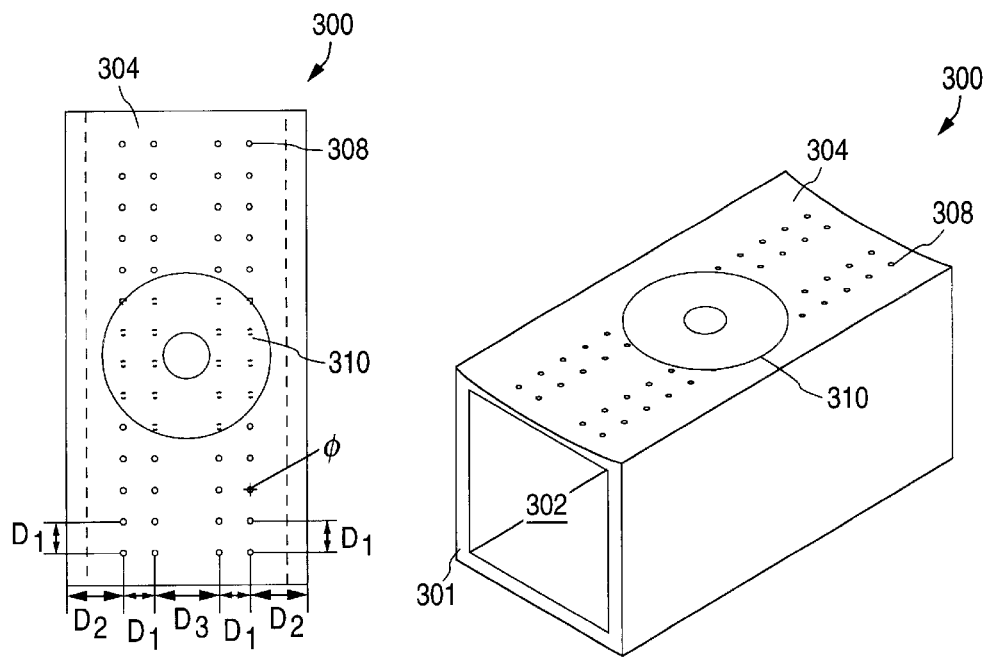
FIGS. 4A, 4B, 4C, and 4D show various views of an air track in accordance with another embodiment of the invention.
Figure 4A:
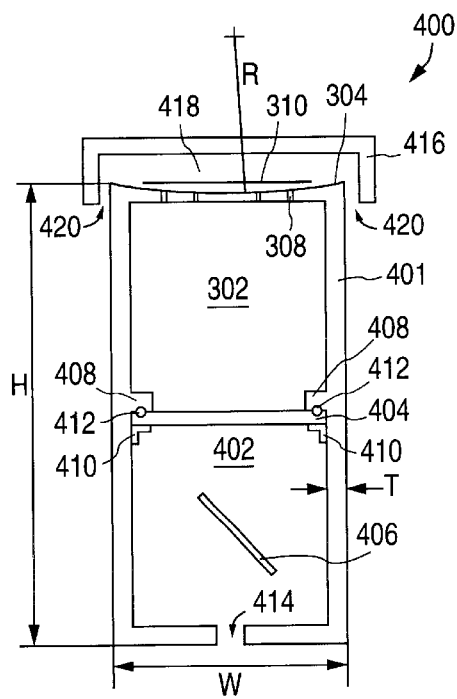
Figure 4B:
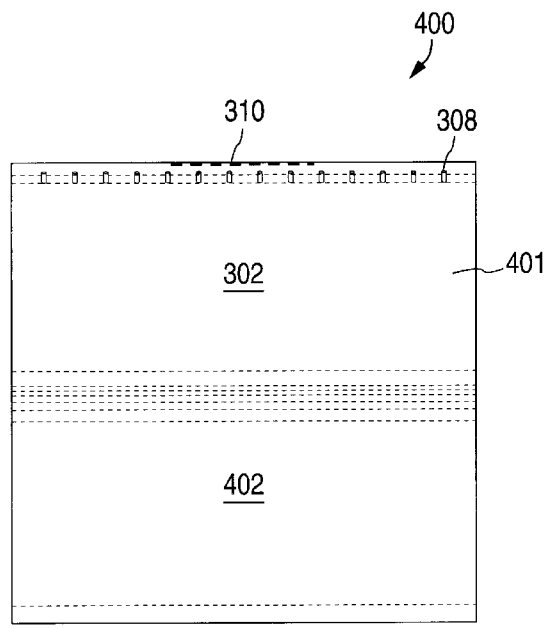
Figure 4C:
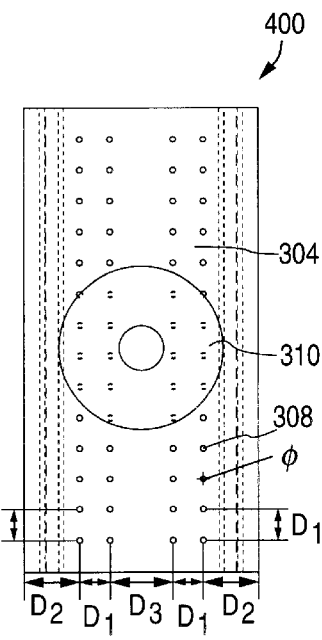
Figure 4D:
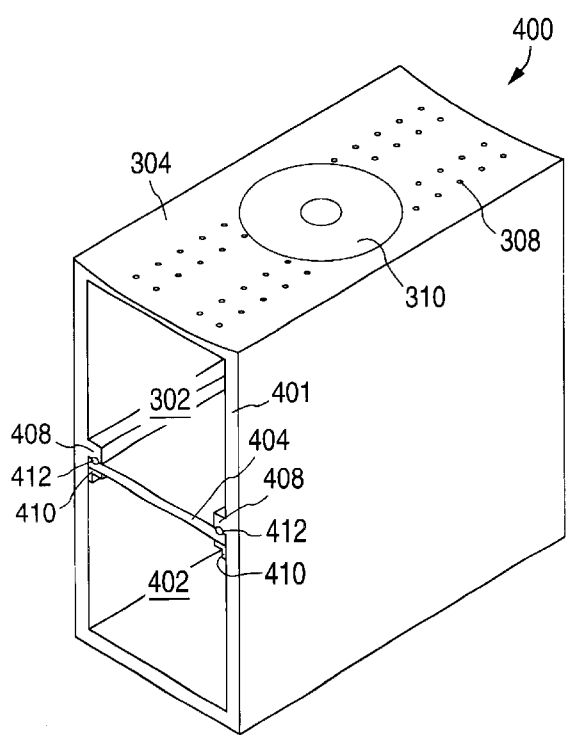
Figure 5A:
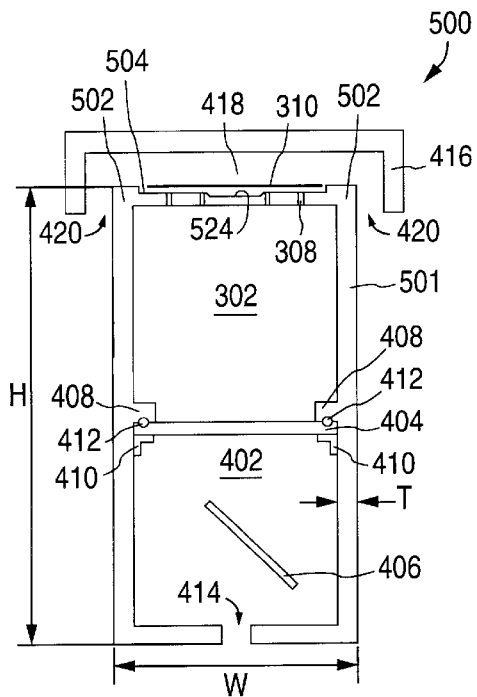
FIGS. 5A, 5B, 5C, 5D, and 5E show various views of an air track in accordance with yet another embodiment of the invention.
Figure 5C:
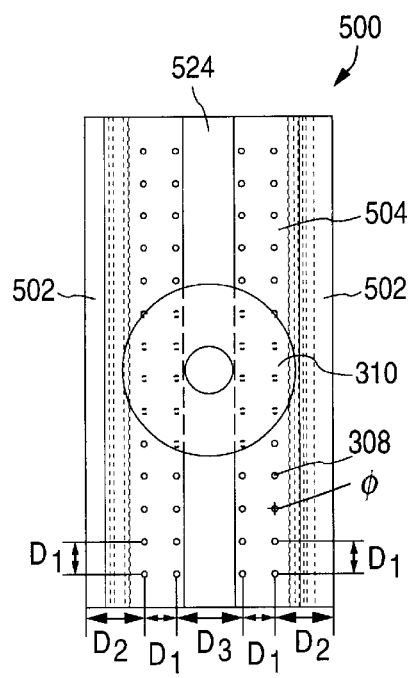
Figure 5B:
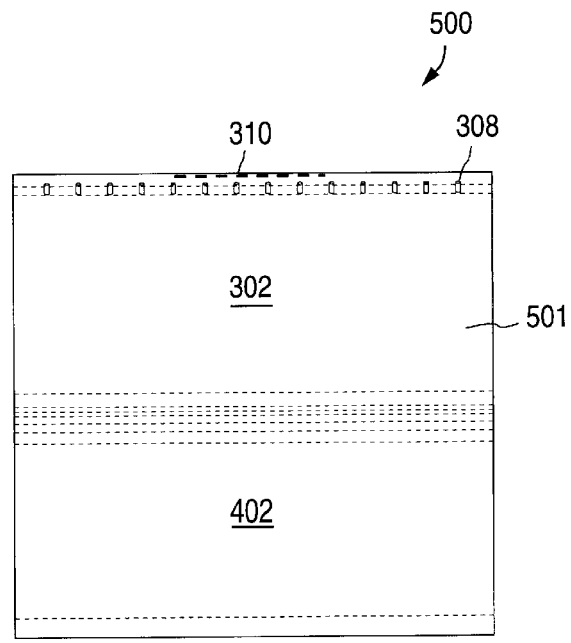
Figure 5D:
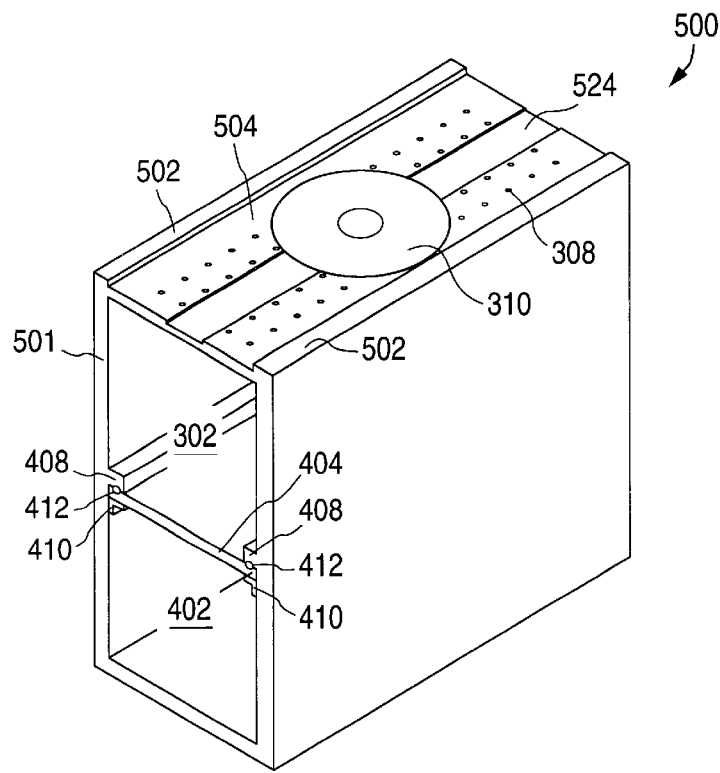
Figure 5E:
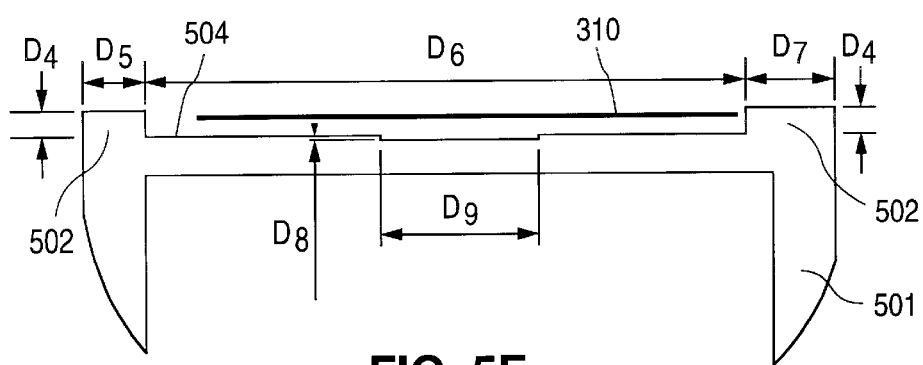
Figure 6A:
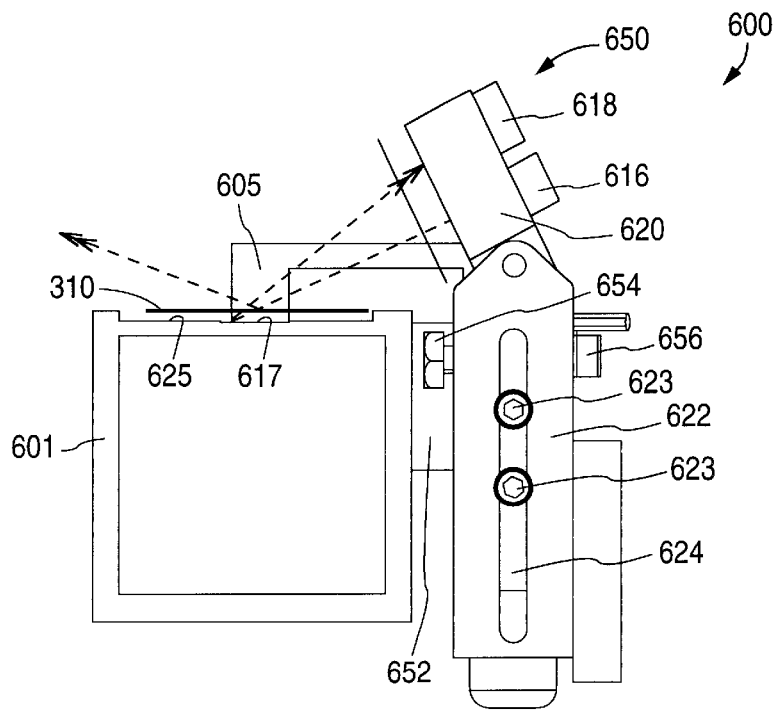
FIGS. 6A, 6B, 6C, and 6D show various views of a stopper assembly in accordance with one embodiment of the invention.
Figure 6B:
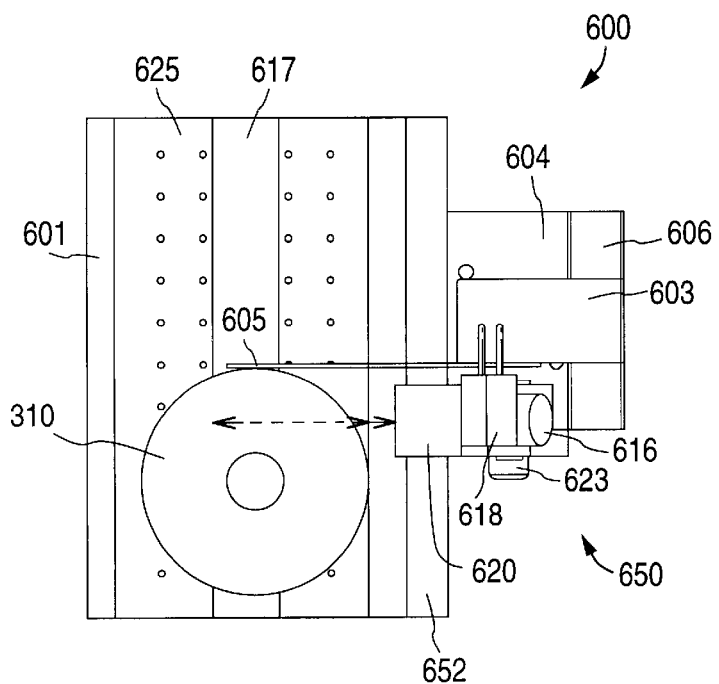
Figure 6C:
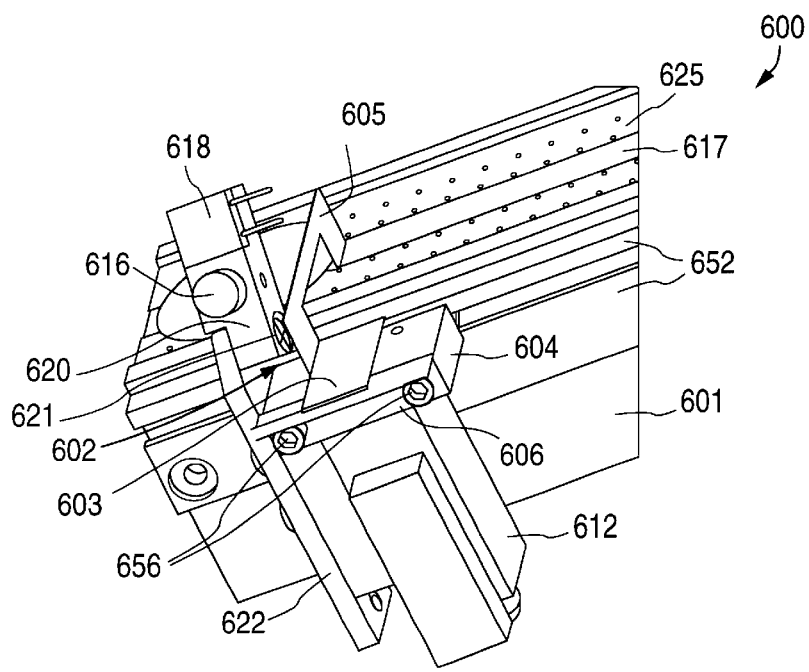
Figure 6D:
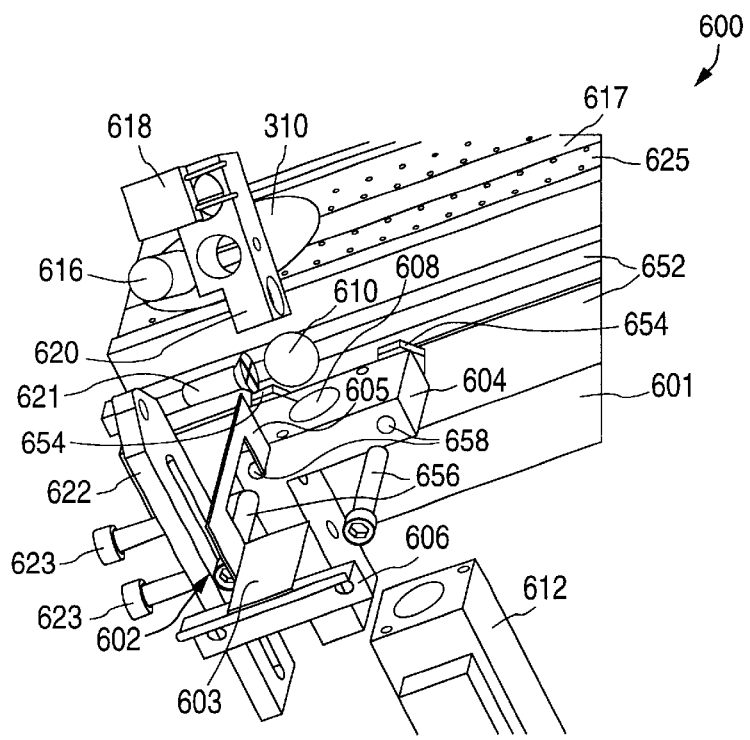

The curvature of top surface 304 guides disk 310 along a predetermined path on air track 300. As FIG. 3A illustrates, air outlets 308 located near the sides of air track 300 are closer to disk 310 than air outlets 308 located near the center of air track 300. Thus, air outlets 308 located near the sides exert more force on disk 310 than air outlets 308 located near the center. The balance of these forces centers disk 310 along air track 300. Accordingly, physical restraints are not needed to guide disk 310 along a predetermined path on air track 300.

Air track 300 can be positioned at an angle relative to its length to allow gravity to move disk 310 along a predetermined path on air track 300. For example, air track 300 can be tilted 0 to 10 degrees relative to its length. Alternatively, air outlets 308 can be angled to push disk 310 along a predetermined path on air track 300.

FIGS. 4A–4D illustrate an air track 400 in accordance with another embodiment of the invention. Air track 400 includes a body 401 and at least one air filter 404 that runs along the length of at least a portion of body 401. Air filter 404 is, e.g., a 0.1 micron filter. Air filter 404 divides body 401 into top plenum 302 and bottom plenum 402. Body 401 has concave top surface 304 and air outlets 308. Body 401 may be constructed from a single or multiple pieces of material. Exemplary dimensions of body 401 are provided below.

TABLE 2

| | |
|---|---|
| D1 | 0.2 in. |
| D2 | 0.35 in. |
| D3 | 0.4 in. |
| Ø | 0.03 |
| H | 3 in. |
| W | 1.5 in. |
| T | 0.125 in. |
| R | 100 mm |

Air enters body 401 through air inlet 414. Air then travels from plenum 402 to plenum 302 through filter 404. Air then exit plenum 302 through air outlets 308. Depending on the implementation, a baffle 406 can be placed in plenum 402 to equalize the pressure therein. Clamps 408 and 410 support filter 404 between against the side walls of body 401. Depending on the implementation, clamps 408 and 410 may be formed as part of body 401, or as separate pieces attached to body 401. Filter 404, clamps 408 and 410 all run along the length of at least a portion of body 401. Gaskets 412 are fitted between clamps 408 and filter 404 to ensure only filtered air travels from plenum 402 to 302. Gaskets 412 are, e.g., a Viton® fluoroelastomer gaskets.

Filter 404 removes contaminants from the air so disk 310 is not contaminated by the air. Filter 404 also causes a large pressure drop from plenum 402 to plenum 302. The large pressure drop creates uniform air pressure within plenum 302. The uniform pressure within plenum 302 ensures that the air exits evenly through air outlets 308 so that disk 310 is supported at a consistent height and no turbulent air flow exists.

A protective hood 416 is positioned over top surface 304. Hood 416 runs along the length of at least a portion of body 401. Hood 416 forms an enclosure 418 over top surface 304 where air escapes from enclosure 418 through spaces 420. Hood 416 prevents contaminants from collecting atop disk 310 as it travels along air track 300. Furthermore, the air from air outlets 308 creates positive pressure within enclosure 418 to prevent contaminants from entering and contaminating disk 310 through spaces 420.

FIGS. 5A–5E illustrate air track 500 in yet another embodiment of the invention. As can be seen, body 501 has a top surface 504 that is flat instead of concave. Body 501 also includes edges (walls) 502 that guide disk 310 along air track 500. In some implementations, a portion of top surface 504 is removed or altered. For example, top surface 504 includes a notch 524 that runs along the length of at least a portion of top surface 504. A flat top surface 504 may be less expensive to produce than a concave top surface 304 because it requires less complicated machining. However, disk 310 may be contaminated from contact with edges 502. In other aspects, air track 500 is same as air track 400 of FIGS. 4A–4D. Exemplary dimensions of body 501 are provided below.

TABLE 3

| | |
|---|---|
| D1 | 0.2 in. |
| D2 | 0.35 in. |
| D3 | 0.4 in. |
| D4 | 0.0625 in. |
| D5 | 0.125 in. |
| D6 | 1.2 in. |
| D7 | 0.175 in. |
| D8 | 0.01 in. |
| D9 | 0.31 in. |
| Ø | 0.03 |
| H | 3 in. |
| W | 1.5 in. |
| T | 0.125 in. |

A portion of air track 500 can be positioned at an angle relative to its width so disk 310 rests against one of edges 502 (e.g., a "reference edge") while it is stationary or traveling along air track 500. Placing disk 310 against a reference edge allows disk 310 to be consistent positioned in a predetermined location at a processing station. Alternatively, air outlets 308 can be angled to push disk 310 along air track 500 and/or against the reference edge.

FIGS. 6A–6D illustrate a stopper assembly 600 in one embodiment of the invention. Stopper 600 includes an arm 602 pivotally mounted to a frame 604 through a flexure hinge 606. Arm 602 includes a vertical section 605 to contact disk 310 and a horizontal section 603 used to control movement of arm 602. Horizontal section 603 rests atop a bore 608 of frame 604. A ball bearing 610 is placed within bore 608. An electric solenoid 612 (e.g., an actuator) is mounted to frame 604 below bore 608 so ball bearing 610 rests against the plunger (not shown) of solenoid 612. Depending on the implementation, solenoid 612 can be activated or deactivated to push ball bearing 610 against horizontal section 603 to raise vertical section 605 so disk 310 can pass stopper 600 on air track 601. Otherwise vertical section 605 rests on or near a top surface 625 of air track 601 to arrest the motion of disk 310 (e.g., to buffer disk 310). Contacts between vertical section 605 and top surface 625 can generate particles that contaminate disk 310. Thus, it is preferred to rest vertical section 605 near top surface 625 without contacting top surface 625. In one embodiment, a portion of vertical section 605 rests above a notch 617 on top surface 625.

Stopper 600 is mounted to the side of an air track 601 (representing any of air tracks 300, 400, and 500) at a predetermined location ("stopper position"). Air track 601 includes a C-shaped slotted channel 652 where stopper 600 can be mounted. Nuts 654 (shown in FIGS. 6A, 6C, and 6D) are inserted into channel 652. Bolts 656 (shown in FIGS. 6A, 6C, and 6D) are passed through bores 658 (shown in FIG. 6D) on frame 604 to secure frame stopper 600 to channel 652.

In one embodiment, stopper 600 includes a disk detector 650. Disk detector 650 includes a light source 616 (e.g., a laser), a photo-detector 618, a frame 620, and a frame 622. Light source 616 and photo-detector 618 are mounted on frame 620. Frame 620 is pivotally mounted to frame 622 via a screw 621 (shown in FIGS. 6C and 6D). Frame 622 includes a slot 624 that allows screws 623 to secure frame 622 to frame 604 at various heights. Light source 616 shines a light toward a corner of a slot 617 (representing any slot or notch) on air track 601. Photo-detector 618 detects the light reflected from the corner of notch 617 when disk 310 is not in the path of the light. Conversely, photo-detector 618 detects a lower amount of light when disk 310 is in the path of the light because disk 310 reflects the light to another direction. The path of the light can be aligned by changing the angle at which frame 620 is mounted to frame 622, and the height at which frame 622 is mounted to frame 604.

Depending on the implementation, arm 602 can be raised or lowered when disk 310 is detected. For example, arm 602 can be lowered to stop disk 310 when a processing station is not ready to process disk 310. Arm 602 can also be lowered to arrest the motion of disk 310 so it can be removed from air track 601 for processing. The stopper assembly 600 advantageously arrests the motion of disk 310 without changing the height of disk 310 on air track 601.

Figure 10:
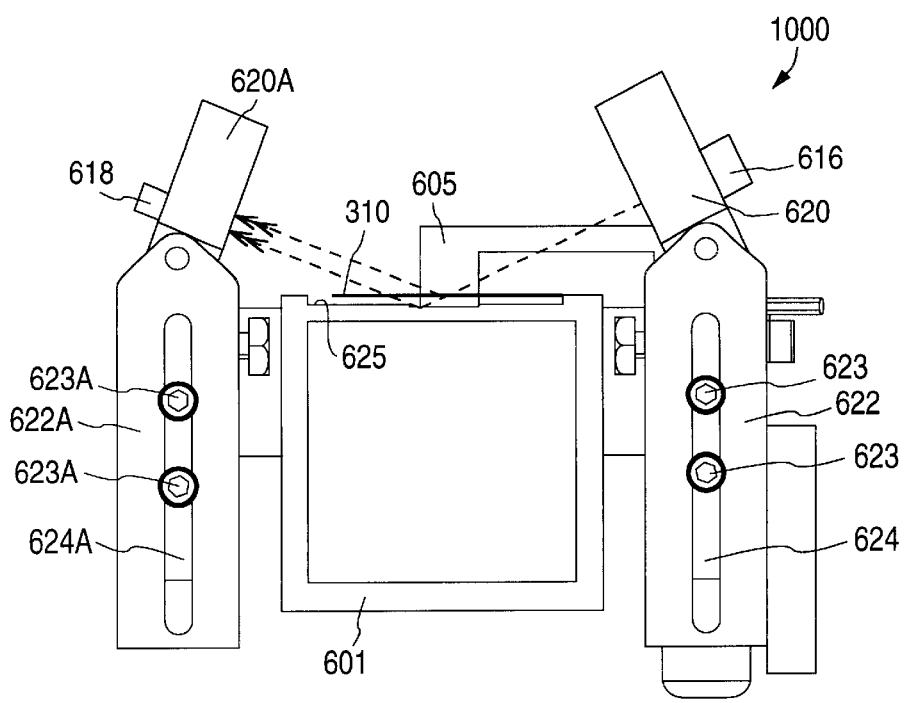
FIG. 10 shows a front view of a stopper assembly similar to the stopper of FIG. 6 in accordance with another embodiment of the invention.

FIG. 10 illustrates a stopper assembly 1000 in one embodiment. Stopper assembly 1000 is the same as stopper assembly 600 except that photo-detector 618 is moved to an opposing side of air track 601 and air track 601 does not have a slot 617. The same structure used to mount light source 616 can be used to mount photo-detector 618 on the opposing side of air track 601. For example, photo-detector 618 is mounted on a frame 620A. Frame 620A is pivotally mounted to a frame 622A. Frame 622A includes a slot 624A that allows screws 623A to secure frame 622A to frame 604A at various heights. Frame 622A is mounted to air track 601.

Light source 616 shines a light toward top surface 625 of air track 601. Light source 616 and photo-detector 618 are aligned such that top surface 625 reflects the light to photo-detector 618 when disk 310 is not in the path of the light. In this implementation, photo-detector 618 detects light when disk 310 is not present. Alternatively, light source 616 and photo-detector 618 are aligned such that top surface of disk 310 reflects the light to photo-detector 618 when disk 310 is in the path of the light. In this implementation, photo-detector 618 detects light when disk 310 is present. Stopper 1000 can work equally well for an air track 601 with a concave top surface 625.

Figure 7A:
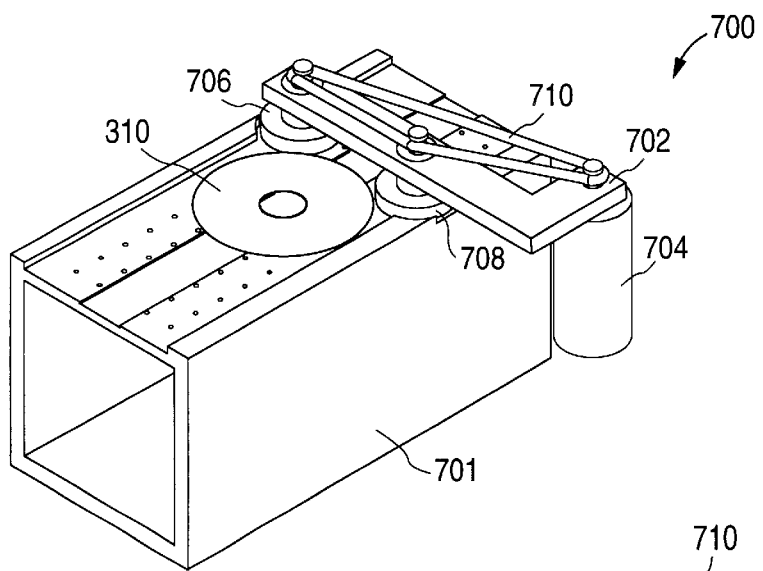
FIGS. 7A, 7B, and 7C show various views of a stopper assembly in accordance with another embodiment of the invention.
Figure 7B:
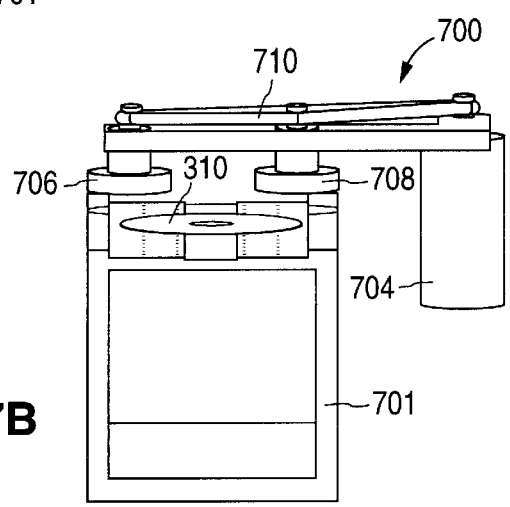
Figure 7C:
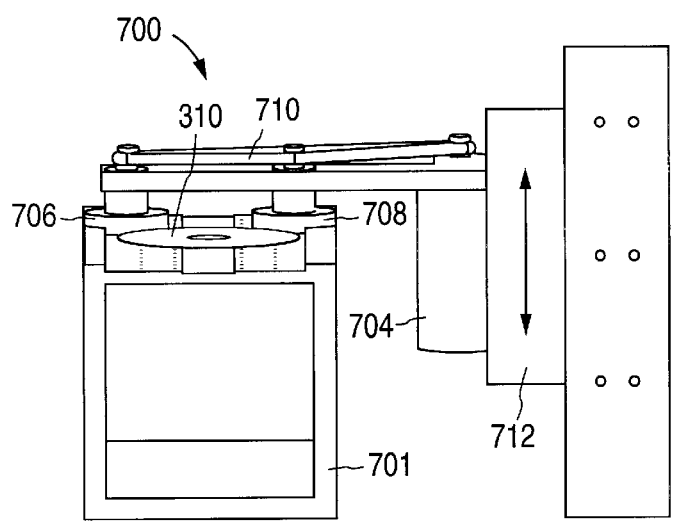

FIGS. 7A–7C illustrate a stopper assembly 700 in one embodiment of the invention. Stopper 700 is mounted to the side of an air track 701 (representing any of air tracks 300, 400, and 500). Stopper 700 includes an L-shaped frame 702 with a drive motor 704 and drive rollers 706 and 708 mounted thereon. Drive motor 704 rotates drive rollers 706 and 708 via a belt 710. Alternatively, drive motor 704 rotates drive rollers 706 and 708 via a set of gears or any other conventional drive mechanism. A linear stage 712 moves frame 702 down to arrest the motion of disk 310 on air track 701. Conversely, stage 712 moves frame 702 up to allow passage of disk 310. Although not shown, the disk detector of FIGS. 6A–6D can be mounted to air track 701 upstream from stopper 700 to detect the presence of disk 310.

Once stopper 700 has stopped disk 310, drive motor 704 can drive driver rollers 706 and 708 to rotate disk 310 so it can be processed and/or inspected in-situ. For example, a processing equipment can perform optical inspection, laser texturing, spin rinse drying, and spin coating on disk 310 without removing it from air track 701. In one implementation, disk 310 has a bar code that can be read when disk 310 is rotated by stopper 700. Like stopper 600, stopper 700 advantageously arrests the motion of disk 310 without changing the height of disk 310 on air track 701.

Figure 8A:
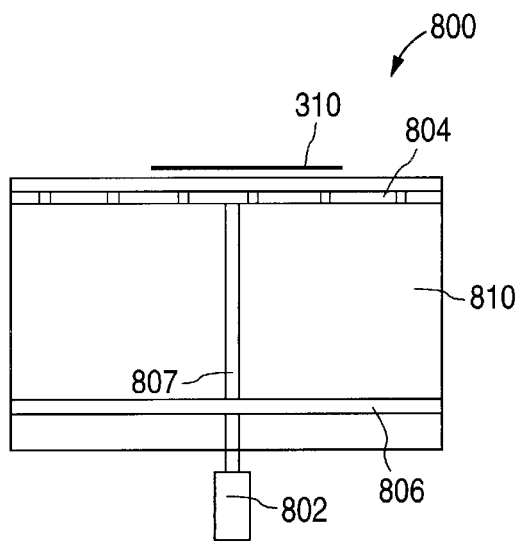
FIGS. 8A, 8B, 8C, and 8D show various views of a stopper assembly in accordance with yet another embodiment of the invention.
Figure 8B:
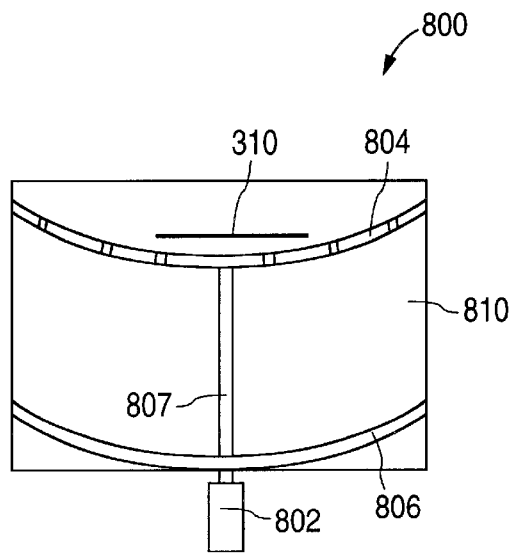

FIGS. 8A and 8B illustrate a stopper assembly 800 in one embodiment of the invention. Stopper 800 includes a top surface 804 and a bottom surface 806 made of a flexible material such as thin spring steel. Top surface 804 can be flat or concave as described above. Top surface 804 and bottom surface 806 are coupled by cross-members 807. An actuator 802 is connected to bottom surface 806. Actuator 802 is, e.g., a pneumatic piston. As FIG. 8B shows, the actuator pulls a portion of bottom surface 804 and top surface 806 downwards while sides 810 remain stationary when it is desired to stop disk 310. Disk 310 then comes to rest at the lowered portion of top surface 804 from the forces of gravity. Disk 310 can continue along its path when actuator 802 releases the lowered portion of top surface 804.

Figure 8C:
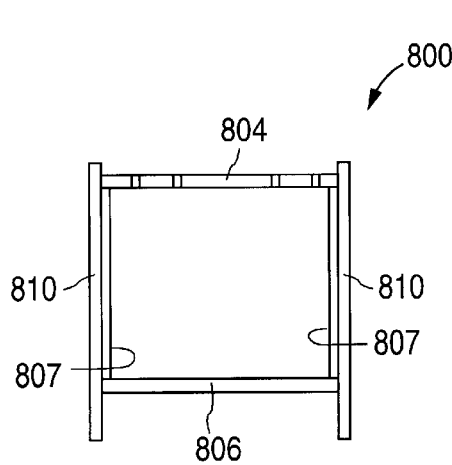
Figure 8D:
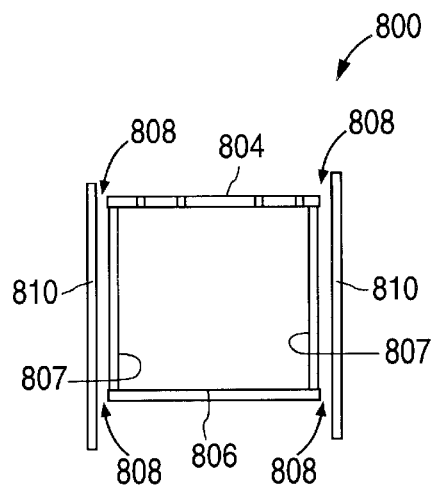

FIG. 8C shows that top surface 804 and bottom surface 806 can slide against sides 810 when lowered. Alternatively, FIG. 8D shows that air gaps 808 can be provided between sides 810 and surfaces 804 and 806 so that surfaces 804 and 806 are lowered without sliding against sides 810. Such a configuration will have a predictable leak from stopper 800 but will not generate particles that can contaminate disk 310 from surfaces 804 and 806 sliding against sides 810

Figure 9:
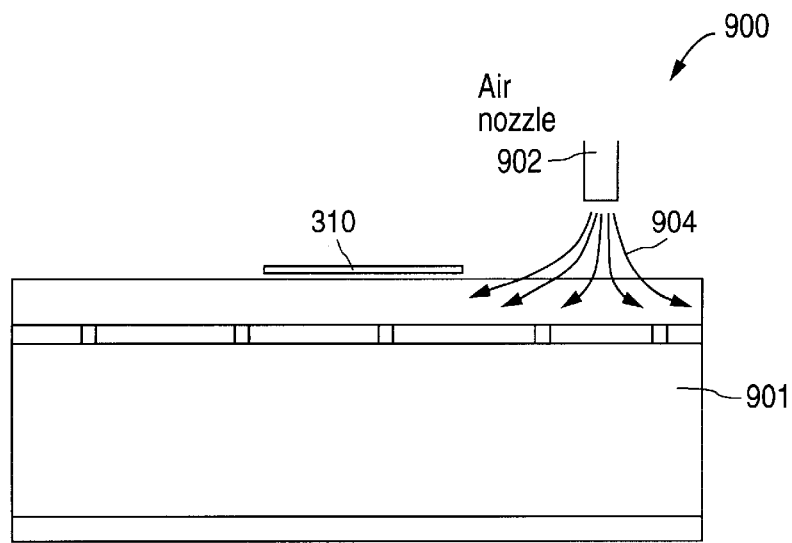
FIG. 9 shows a side view of an air stopper assembly in accordance with one embodiment of the invention.

FIG. 9 illustrates a stopper assembly 900 in one embodiment of the invention. In this embodiment, an air nozzle 902 is placed above air track 901 (representing any of air tracks 300, 400, and 500) to supply air 904 onto the top surface of air track 901 to arrest the motion of disk 310. Air 904 pushes against disk 310 so disk 310 cannot travel beyond air nozzle 902.

Although the invention has been described with reference to particular embodiments, the description is only of examples and should not be taken as a limitation. Various other adaptations and combinations of features of the embodiments disclosed are within the scope of the invention as defined by the following claims.

What is claimed is:

1. An air track which pneumatically conveys articles on an air cushion comprising:
   a body having a top surface including a plurality of air outlets; and
   at least one air filter running along the length of at least a portion of the body, the air filter dividing the body into a first plenum that is above a second plenum.

2. The air track of claim 1, wherein the top surface is flat.

3. The air track of claim 2, wherein the top surface includes a notch located approximately at the center of the top surface and runs along the length of at least a portion of the top surface.

4. The air track of claim 1, wherein the body further includes edges along the top surface that guides a disk.

5. The air track of claim 1, further comprising a baffle in the second plenum.

6. The air track of claim 1, further comprising a hood above a top surface of the first plenum, wherein the hood runs along the length of at least a portion of the top surface.

7. The air track of claim 1, further comprising a stopper assembly located adjacent to the top surface, the stopper assembly comprising:
   a first frame;
   an arm movably mounted to the first frame; and
   an actuator moving the arm among at least a first position and a second position, wherein:
      in the first position, the arm rests on or near the top surface to arrest the motion of a disk; and
      in the second position, the arm is raised above the top surface to allow passage of the disk.

8. The air track of claim 2, wherein the stopper further includes a disk detector comprising:
   a light source, the light source transmitting a light toward the top surface; and a light sensor aligned with the light source to receive reflected light to determine when the disk is at the stopper position.

9. The air track of claim 1, further comprising a stopper assembly located adjacent to the top surface, the stopper assembly comprising:
   a stage;
   a frame mounted to the stage, the frame comprising;
      at least two rollers rotatably mounted to the frame; and
      a motor mounted to the frame to drive the rollers via a drive mechanism; and wherein:
         the stage lowers the frame so the rollers contact a disk on the top surface and arrest the linear motion of the disk; and
         the motor drives the rollers to rotate the disk.

10. The air track of claim 9, wherein the drive mechanism includes a belt or a set of gears.

11. An air track which pneumatically conveys articles on an air cushion comprising:
   a body including a top surface having a plurality of air outlets, wherein the top surface includes a notch;
   a hood positioned above the top surface, wherein the hood runs along the length of at least a portion of the top surface; and
   a stopper assembly located adjacent to the top surface, the stopper assembly comprising:
      a stage;
      a frame mounted to the stage, the frame comprising;
         at least two rollers rotatably mounted to the frame; and
         a motor mounted to the frame to drive the rollers via a drive mechanism; and wherein:
            the stage lowers the frame so the rollers contact a disk on the top surface and arrest the linear motion of the disk; and
            the motor drives the rollers to rotate the disk.

12. The air track of claim 11, wherein the notch is located at approximately the center of the top surface and runs along the length of at least a portion of the top surface.

13. The air track of claim 11, further comprising a stopper assembly located adjacent to the top surface, the stopper assembly comprising:
   a first frame;
   an arm movably mounted to the first frame; and
   an actuator moving the arm among at least a first position and a second position, wherein:
      in the first position, the arm rests on or near the top surface to arrest the motion of a disk; and
      in the second position, the arm is raised above the top surface to allow passage of the disk.

14. The air track of claim 13, wherein the stopper further includes a disk detector comprising:
   a light source, the light source transmitting a light toward the top surface; and
   a light sensor aligned with the light source to receive reflected light to determine when the disk is at the stopper position.

15. The air track of claim 11, wherein the drive mechanism includes a belt or a set of gears.

16. An air track for pneumatically transporting disks, the air track comprising:
   a body having a top surface including a notch; and
   at least one air filter within the body, the air filter running along the length of at least a portion of the body and dividing the body into a first plenum that is above a second plenum.

17. The air track of claim 16, further comprising a baffle in the second plenum.

18. The air track of claim 16, further comprising a stopper assembly located adjacent to the top surface, the stopper assembly comprising:
   a first frame;
   an arm movably mounted to the first frame; and
   an actuator moving the arm among at least a first position and a second position, wherein:
      in the first position, the arm rests on or near the top surface to arrest the motion of a disk; and
      in the second position, the arm is raised above the top surface to allow passage of the disk.

19. The air track of claim 18, wherein the stopper further includes a disk detector comprising:
   a light source, the light source transmitting a light toward the top surface; and
   a light sensor aligned with the light source to receive reflected light to determine when the disk is at the stopper position.

20. The air track of claim 16, further comprising a stopper assembly located adjacent to the top surface , the stopper assembly comprising:
   a stage;
   a frame mounted to the stage, the frame comprising;
      at least two rollers rotatably mounted to the frame; and
      a motor mounted to the frame to drive the rollers via a drive mechanism; and wherein:
         the stage lowers the frame so the rollers contact a disk on the top surface and arrest the linear motion of the disk; and
         the motor drives the rollers to rotate the disk.

21. The air track of claim 20, wherein the drive mechanism includes a belt or a set of gears.

22. An air track for transporting disks, the air track comprising:
   a body having:
      a top surface having a plurality of air outlets; and
      at least one air filter within the body, the air filter running along the length of at least a portion of the body and dividing the body into a first plenum that is above a second plenum; and
   a stopper assembly located adjacent to the top surface, the stopper assembly comprising:
      a first frame;
      an arm movably mounted to the first frame;
      an actuator moving the arm among at least a first position and a second position, wherein:
         in the first position, the arm rests on or near the top surface to arrest the motion of a disk; and
         in the second position, the arm is raised above the top surface to allow passage of the disk;
      a light source, the light source transmitting a light toward the top surface; and
      a light sensor aligned with the light source to receive reflected light to determine when the disk is at the stopper position.

23. An air track for transporting disks, the air track comprising:
   a body having a top surface having a plurality of air outlets; and
   a stopper assembly located adjacent to the top surface, the stopper assembly comprising:
      a stage;
      a frame mounted to the stage, the frame comprising;

at least two rollers rotatably mounted to the frame; and a motor mounted to the frame to drive the rollers via a drive mechanism; and wherein:

the stage lowers the frame so the rollers contact a disk on the top surface and arrest the linear motion of the disk; and the motor drives the rollers to rotate the disk.

24. An air track for transporting disks, the air track comprising:

a body having:

a top surface having a plurality of air outlets; and at least one air filter within the body, the air filter running along the length of at least a portion of the body and dividing the body into a first plenum that is above a second plenum; and a stopper assembly located adjacent to the top surface, the stopper assembly comprising:

a stage;

a frame mounted to the stage, the frame comprising;

at least two rollers rotatably mounted to the frame; and a motor mounted to the frame to drive the rollers via at least one belt; and wherein:

the stage lowers the frame so the rollers contact a disk on the top surface and arrest the linear motion of the disk; and the motor drives the rollers to rotate the disk.

\* \* \* \* \*